(12) United States Patent
Whitney et al.

(10) Patent No.: US 9,423,191 B2
(45) Date of Patent: Aug. 23, 2016

(54) FASTENER ASSEMBLY AND METHOD FOR HEAT SINK MOUNTING

(71) Applicant: Aavid Thermalloy, LLC, Laconia, NH (US)

(72) Inventors: Bradley R. Whitney, Epsom, NH (US); Randolph H. Cook, Gilford, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 294 days.

(21) Appl. No.: 14/446,506

(22) Filed: Jul. 30, 2014

(65) Prior Publication Data

US 2014/0352940 A1 Dec. 4, 2014

Related U.S. Application Data

(63) Continuation of application No. PCT/US2013/024285, filed on Feb. 1, 2013.

(60) Provisional application No. 61/593,438, filed on Feb. 1, 2012.

(51) Int. Cl.

| | |
|---|---|
| *B25G 3/00* | (2006.01) |
| *F16D 1/00* | (2006.01) |
| *F28F 9/26* | (2006.01) |
| *H01L 23/40* | (2006.01) |
| *B23P 15/26* | (2006.01) |
| *F16B 21/12* | (2006.01) |
| *F28F 3/02* | (2006.01) |

(Continued)

(52) U.S. Cl.
CPC .................. *F28F 9/26* (2013.01); *B23P 15/26* (2013.01); *F16B 21/12* (2013.01); *F28F 3/02* (2013.01); *H01L 23/4093* (2013.01); *F16B 21/065* (2013.01); *F16B 21/086* (2013.01); *H01L 2924/0002* (2013.01); *Y10T 29/4935* (2015.01)

(58) Field of Classification Search
CPC ...... F16B 7/0406; F16B 7/182; F16B 7/042; F16B 7/105; F16B 13/0891; F16B 21/165; F16B 12/40; A45F 5/00
USPC ................................................ 403/299, 322.2
See application file for complete search history.

(56) References Cited

U.S. PATENT DOCUMENTS

| | | |
|---|---|---|
| 4,760,495 A | 7/1988 | Till |
| 4,813,810 A * | 3/1989 | Suzuki .................... F16D 1/116 403/322.2 |
| 6,280,116 B1 | 8/2001 | Szu |

(Continued)

OTHER PUBLICATIONS

International Search Report and Written Opinion dated May 14, 2013 from corresponding PCT Application No. PCT/US2013/024285.

*Primary Examiner* — Davis Hwu
(74) *Attorney, Agent, or Firm* — Wolf, Greenfield & Sacks, P.C.

(57) ABSTRACT

Method and assembly for attaching a heat sink to a heat source surface associated with a printed circuit board or other component having a heat source. A fastener assembly may include a push pin with a barbed, bifurcated end arranged to be inserted through an opening of the printed circuit board and thereby secure the heat sink to the printed circuit board. A stopper may be headless, be separable from the push pin, and have a portion, such as a barrel-shaped element, positionable in a throughbore of the push pin that supports the bifurcated end so that movement of the barbed portions toward each other is resisted, thereby securing engagement of the barbed portions with the printed circuit board.

19 Claims, 8 Drawing Sheets

(51) Int. Cl.
 *F16B 21/06* (2006.01)
 *F16B 21/08* (2006.01)

(56) References Cited

U.S. PATENT DOCUMENTS 6,307,748 B1 10/2001 Lin
8,424,423 B2 * 4/2013 Su .................... B25B 15/001
 403/322.2
8,480,329 B2 * 7/2013 Fluhr .................. F41A 11/00
 403/319
2003/0178226 A1 9/2003 Liu
2008/0037225 A1 2/2008 Yang
2008/0284005 A1 11/2008 Wong
2013/0263432 A1 * 10/2013 Goldberg ............ B43M 15/00
 29/525.03

* cited by examiner

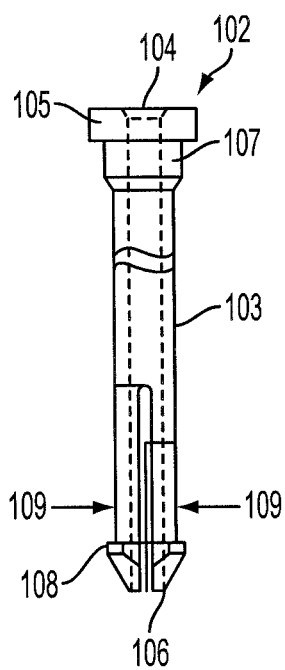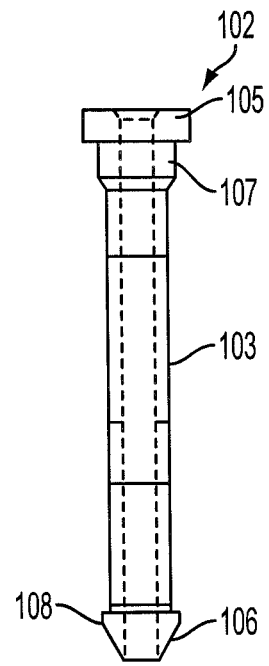
FIG. 3   FIG. 4
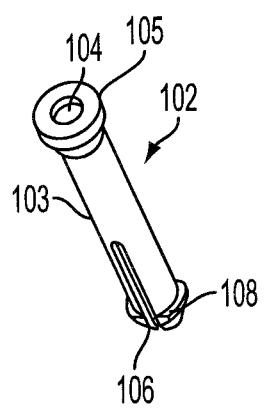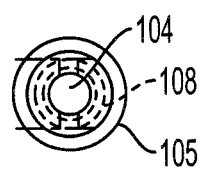
FIG. 5   FIG. 6

FASTENER ASSEMBLY AND METHOD FOR HEAT SINK MOUNTING

CROSS REFERENCE TO RELATED APPLICATIONS

This application is a continuation of International Application No. PCT/US2013/024285, filed Feb. 1, 2013, which claims the benefit of U.S. Provisional Application No. 61/593,438, filed Feb. 1, 2012, each of which is hereby incorporated by reference in its entirety.

BACKGROUND

1. Field of the Invention

Push pin fasteners for use in securing heat sinks to printed circuit boards and/or other components to cool heat-generating electric devices mounted to the component.

2. Description of Related Art

As shown in FIG. 1, plastic push pins 10 with bifurcated barbed ends 12 are known for use in mounting heat sinks to electric circuit boards containing heat generating devices. When such pins are inserted into mounting holes on one side of a circuit board, the bifurcated ends will compress until they extend through the hole to the other side of the circuit board, whereupon the ends will return to their normal position and the barbs engage the other side of the board. A drawback of such pins is that the barbed ends may be abraded or break off during insertion or during use of the device, whereupon the pins will no longer stay in place.

As shown in FIG. 2, plastic push pins also exist with stoppers or plungers 14, wherein the stopper is depressed when the pins are in place in the circuit board. When the stopper is depressed, the distal end (which is not bifurcated or otherwise split) is maintained in an expanded condition. Such known pins are also provided with a coil spring 16 on the outside of the pin to provide an opposing force in a direction opposite of the pin insertion direction to assist in engagement of the distal end against the circuit board and thereby provide a clamping force between an intermediate structure through which the pin passes and the circuit board. A drawback, however, is that the plastic material is still subject to breakage during, for example, shock and vibration testing.

Metal (e.g., brass) push pins with bifurcated ends are considered more robust than plastic pins as the barbs that grab the back side of the printed circuit board are stronger than plastic barbs. A problem, however, is that variation in the designs (slot length, square or radius slot end), difference in material properties (yield strength), and other factors like minor differences in the printed circuit board hole size have allowed failures to occur with metal push pins as well.

SUMMARY OF INVENTION

Aspects of the invention provide a fastener assembly for use in securing a heat sink to a component, such as a printed circuit board, having a heat source, such as a computer processor, heat pipe, etc. In one embodiment, the fastener includes a push pin (e.g., made of metal) having an elongated body with a bifurcated or otherwise split distal end and a throughbore extending longitudinally through the elongated body. The bifurcated distal end may have a pair (or more) of movable portions that are movable to flex toward and away from each other and arranged to engage at a hole of the component. For example, the movable portions may each have a barb or other engagement feature arranged to engage with a part of the component at the hole. In some embodiments, the barbed portions may pass through the hole and engage with the component at areas near the hole. A stopper may be separable from the push pin and used to help maintain engagement of the movable portions with the component. Also, in some embodiments, the stopper may be headless. For example, the stopper may have a barrel that is sized to fit within, and be movable longitudinally in, the throughbore so that with a portion of the stopper positioned completely within the throughbore at the bifurcated distal end, the movable portions are prevented from moving toward each other. In this way, the stopper can effectively lock the movable portions into engagement with the component at the hole.

In some embodiments, the elongated body of the push pin may include a slot or groove through the body to form the bifurcated end. A head may be provided at an end of the elongated body opposite the bifurcated end, e.g., to help a user handle the push pin and/or to help the push pin engage with an engaging portion of the heat sink. For example, the body of the push pin may be passed through a hole or other opening of the heat sink, yet the head may be large enough to prevent the push pin from passing through the opening. The stopper may include a cap attached to an end of the barrel, and the cap may be arranged to engage with the head of the push pin, e.g., to help prevent disengagement of the stopper from the push pin. In some embodiments, the stopper may include a bifurcated end at a distal end of the barrel arranged to support the bifurcated end of the push pin. The bifurcated end of the stopper may provide a more resilient support for the bifurcated end of the push pin, allowing the push pin to more resiliently engage the printed circuit board or other component. In some cases, the stopper may include a plurality of circumferential ribs on the barrel and/or include a longitudinal groove that help reduce a force required to move the barrel in the throughbore and/or make the stopper more compliant.

In another aspect, a heat source and heat sink assembly includes a heat source attached to a component support, such as a printed circuit board having one or more openings, and a heat sink having a heat receiving surface in contact with a heat transfer surface of the heat source. At least one fastener assembly may be engaged with a fastener engaging portion of the heat sink (e.g., the fastener assembly may be positioned in a hole formed in the heat sink) and engaged with an opening of the component. In one embodiment, the at least one fastener may include a metal push pin and a stopper arranged with any of the features described above. For example, the push pin may be inserted into a hole of the heat sink, and then inserted into a hole of the component support so that barbed portions of the bifurcated end engage with the component at the hole. The stopper may then have a barrel portion positioned in the throughbore of the push pin to lock the movable portions in engagement with the hole.

In another aspect, a method for engaging a heat source with a heat sink assembly includes providing a heat source attached to a component, such as a printed circuit board having one or more openings, positioning a heat receiving surface of a heat sink in contact with a heat transfer surface of the heat source, engaging a push pin with a fastener engaging portion (such as a hole) of the heat sink, and inserting a bifurcated distal end of the push pin through an opening of the component to attach the heat sink to the component. The bifurcated distal end may include a pair of movable portions that flex toward each other during insertion of the bifurcated end through the opening, and a stopper may be inserted into a throughbore of the push pin so as to position a portion of the stopper in the throughbore at the bifurcated distal end of the push pin. This positioning of the portion of the stopper in the throughbore at the bifurcated distal end may resist movement of the movable portions toward each other to maintain engagement of the bifurcated end with the opening of the component.

In some embodiments, inserting the bifurcated end of the push pin into the component opening includes flexing the movable portions away from each other once barbs on the movable portions pass through the opening so that the barbs engage with a surface of the component at the opening. Thus, the bifurcated end may itself flex to engage the barbs with the component opening. In another embodiment, inserting the stopper into the throughbore may cause the portion of the stopper positioned at the bifurcated end to urge the movable portions away from each other.

These and other aspects of the invention will be apparent from the following description and claims.

BRIEF DESCRIPTION OF THE DRAWINGS

Aspects of the invention are described with reference to the following drawings in which numerals reference like elements, and wherein:

FIG. 3 shows a front view of a push pin component of a fastener assembly in accordance with the invention;

FIG. 4 shows a side view of the FIG. 3 embodiment;

FIG. 5 shows a perspective view of the FIG. 3 embodiment;

FIG. 6 shows a bottom view of the FIG. 3 embodiment;

DETAILED DESCRIPTION

In accordance with one aspect of the invention, a push pin assembly includes a push pin and a stopper that operate together to engage a heat sink or other heat receiving device to a printed circuit board or other component having a heat source (such as a computer processor, heat pipe, etc.). The push pin is arranged to have bifurcated legs that flex to pass through, and engage with, a hole in the printed circuit board or other component substrate, and includes a throughbore arranged to receive the stopper. The stopper functions to extend into the throughbore and support the bifurcated legs in engagement with the circuit board hole. (Repeated reference is made herein to engaging a fastener with a circuit board or circuit board hole, but it should be understood that the fastener may be used to engage a heat sink or other heat receiving device to any suitable component having a heat source. For example, a fastener may be used to connect directly to an integrated circuit device, to a metal plate having one or more heat pipes that transfer heat from one location to another, to a chassis that carries one or more thermoelectric devices, and so on.)

Figure 11:
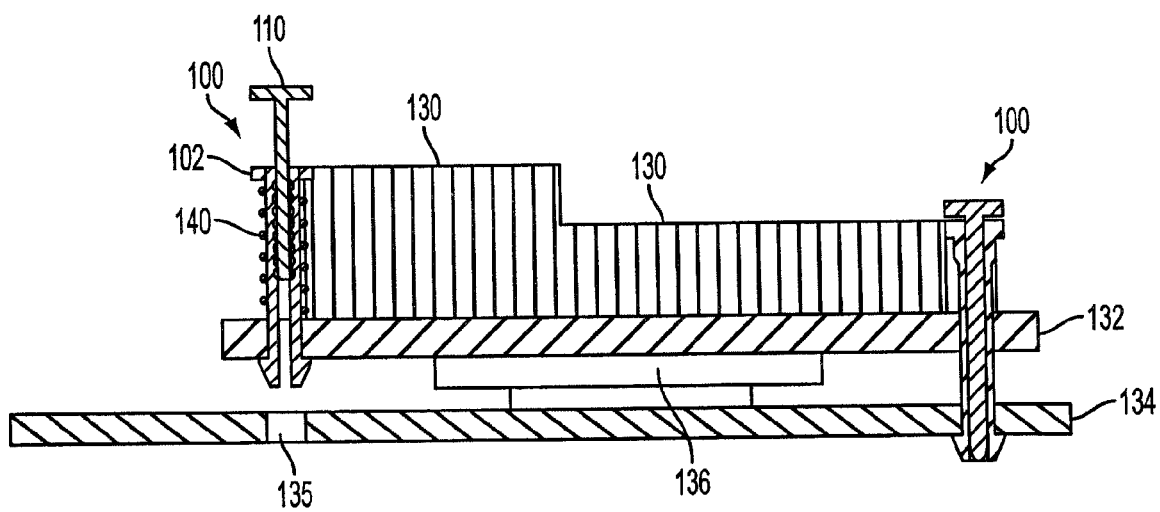
FIG. 11 shows a heat sink and component assembly attached together using the fastener assembly of FIGS. 3-10.

For example, FIG. 11 shows an illustrative embodiment of a push pin assembly used to engage one or more heat sinks 130 having a heat receiving mounting surface 132, to a component 134, in this example a printed circuit board (PCB) having one or more heat sources, such as an electronic device like a computer processor 136 which generates heat. The push pin assembly 100 on the left of FIG. 11 is shown prior to engagement of the assembly 100 with the PCB 134, whereas the push pin assembly 100 on the right shows the assembly 100 engaged with the PCB 134. To engage the assembly 100 with the PCB 134, a distal, bifurcated end of a push pin 102 is inserted into a hole 135 formed in the PCB 134 such that barbs 108 at the bifurcated end engage the underside surface of the PCB 134. Thereafter, the stopper 110, which is separately provided from the push pin in one aspect of the invention, is inserted into a throughbore 104 of the push pin 102, such as by applying pressure with a user's thumb or a tool, so that a barrel 112 of the stopper extends within push pin 102 and supports the barbs 108 at the bifurcated end 106 in engagement with the PCB at the lower side of the hole 135. This secures the push pin assembly 100 in engagement with the PCB, thereby affixing the heat sink 130 to the PCB 134. Once the stopper 110 is fully inserted, a cap 114 of the stopper 110 may rest at the top of the push pin 102. In one aspect of the invention, the cap 114 may be arranged to engage via a snap-fit engagement with the top of the push pin 102. Also, a compression spring 140 may be optionally be positioned to bias the push pin 102 upwardly (as shown in FIG. 11), thereby maintaining the barbs 108 against the underside of the PCB 134 and providing a biasing force that compliantly urges the heat sink(s) 130 into contact with the heat source 136.

FIGS. 3-6 show front, side, top perspective and bottom views of the push pin 102, and FIGS. 7-10 show front, sectional, bottom perspective and bottom views of the stopper 110 in an illustrative embodiment. The push pin 102 may be made of a metal (e.g., brass, etc.) and have an elongated body 103 with a bifurcated end 106 having barbs 108 and a throughbore 104 extending longitudinally through the body 103. Although in the illustrated embodiments, the throughbore 104 extends completely through the elongated body 103 in the longitudinal direction, the throughbore 104 may extend only partially through the body 103, e.g., the extreme distal portion of the bifurcated end 106 may be closed yet still allow the movable portions to flex toward/away from each other. The bifurcation of the body 103 may be provided by a slot or groove formed in the body 103 that allows the barbs 108 to move toward each other (in the direction of arrows 109 in FIG. 3) as the barbs 108 are forced through a hole 135 in a PCB 134 or other component, and to spring back toward an unflexed condition (e.g., as shown in FIG. 3) once the barbs 108 clear the hole 135. This allows upper surfaces of the barbs 108 to engage with the underside of the PCB 134 near the hole 134 and help prevent movement of the pin 102 upwardly relative to the PCB 134. The pin 102 may also have a head 105 (e.g., an enlarged portion at an end of the pin 102 opposite the bifurcated end 106) to help the pin engage properly with a spring 140, assist in handling of the pin 102, engage with the stopper 110, or perform other functions. The body 103 may optionally include a shoulder 107 (e.g., an enlarged diameter portion) to engage with a hole in a heat sink (not shown) and help align the pin 102 relative to the heat sink 130. Also, while the pin 102 is shown having a generally cylindrically-shaped body 103, the body 103 may have other cross-sectional shapes, such as square, star, hexagonal, etc. Also, the barbs 108 are shown as having flats in portions near the slot or groove in the body 103, but the barbs 108 need not have such flats and may be arranged in other ways.

Figure 1:
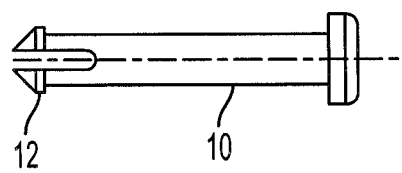
FIG. 1 shows a side view of a prior art fastener.
Figure 2:
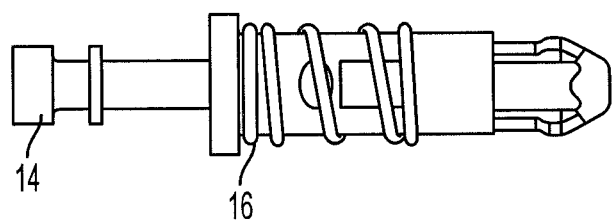
FIG. 2 shows a side view of a prior art fastener including a plunger.
Figure 7:
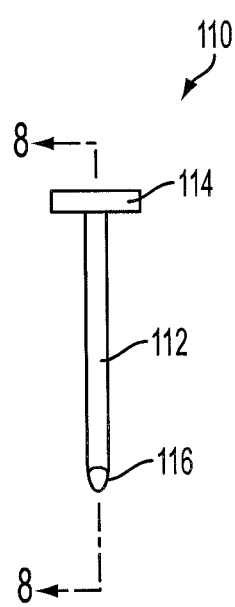
FIG. 7 shows a side view of a stopper for use with the FIG. 3 embodiment.
Figure 8:
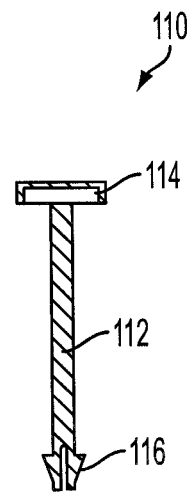
FIG. 8 shows a cross sectional view of the FIG. 7 embodiment along the lines 8-8 in FIG. 7.
Figure 9:
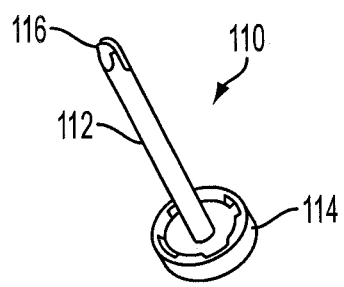
FIG. 9 shows a bottom perspective view of the FIG. 7 embodiment.
Figure 10:
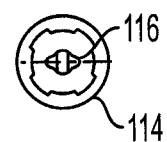
FIG. 10 shows a bottom view of the FIG. 7 embodiment.

As can be seen in FIGS. 7-10, the stopper 110 may be separately provided from a push pin 102 in accordance with an aspect of the invention. This may allow for the use of push pins alone, without a stopper, as well as allow a user to use different stoppers 110 that have different properties, such as different sizes, material compositions, etc., that may affect how the stopper 110 supports the bifurcated end of the push pin 102. In this embodiment, the stopper 110 may have a barrel 112 with a cap 114 at a top end and a tapered and/or bifurcated portion at a bottom end 116. The bottom end 116 may include barbs (e.g., to engage the throughbore 104), or not, and may be arranged to provide a resilient biasing force to the interior of the throughbore 104 of the pin 102 that helps maintain engagement of the barbs 108 with the PCB 134 or other support. For example, after the bifurcated end 106 of the push pin 102 is passed through a hole 135 in a PCB 134, the stopper 110 may be inserted into the throughbore 104 of the push pin 102 so that the bottom end 116 of the stopper 110 supports the bifurcated end 106 in engagement with the PCB 134. While in this illustrative embodiment the bottom end 116 of the stopper 110 includes a bifurcated portion with a slot or groove and tapered or barbed portions at the extreme distal end to provide resilient support for the push pin bifurcated end, such an arrangement is not necessary. Instead, the stopper bottom end 116 may have a solid, or complete tubular or cylindrical configuration that is close in size to the throughbore 104 so that the stopper 110 may help maintain the barbs 108 of the pin 102 in engagement with the PCB hole 135. FIGS. 9 and 10 show an alternative in which the cap 114 includes bayonet or tab features on an underside of the cap 114 that allows the cap 114 to removably (or non-removably) engage with the head 105 of the push pin 102. In one embodiment, the head 105 may include a circumferential groove that engages with the bayonet or tab features of the cap 114 to help maintain the stopper 110 in place. Other arrangements are possible, such as a threaded engagement. The stopper 110 may be made of any suitable material, or combination of materials, such as a plastic.

One possible advantage that may be provided by some embodiments is that the strength and durability of a metal push pin may be provided, even using a metal that is not extremely elastic or resilient, but yet provide improved engagement of the pin with a PCB or other component by way of the stopper. Also, variations in the push pin material properties (e.g., yield strength) and/or push pin dimensions (e.g., slot length at the bifurcated end) may be compensated for by use of a stopper. That is, even if the push pin is not arranged in an ideal way to itself engage with a PCB, the stopper may be used to firmly push the bifurcated end into its spread apart (or engagement) position, ensuring that the barbs properly engage with the PCB. Moreover, different stoppers may be provided for a single type of push pin, allowing for different attachment characteristics for the fastener assembly. For example, some applications may call for a stopper having itself a bifurcated end so that the movable portions of the push pin bifurcated end may be resiliently supported in engagement with the circuit board hole. However, other applications may call for a stopper with a solid end portion, providing for more fixed support of the push pin bifurcated end.

Figure 12:
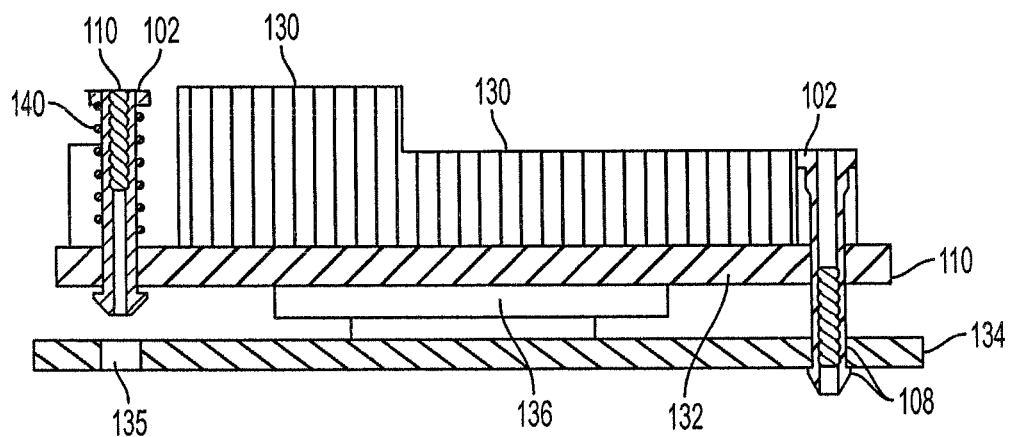
FIG. 12 shows a heat sink and component assembly attached together using an alternate fastener assembly.

Another illustrative embodiment is shown in FIGS. 12-17. In this illustrative embodiment, and in accordance with an aspect of the invention, the push pin 102 is arranged in the same was as in FIGS. 3-11, but the stopper 110 is arranged as a "headless" or "capless" element that is sized to fit entirely within the throughbore 104. For example, as can be seen in FIG. 12, the stopper 110 may be initially deployed in the throughbore 104 of the push pin 102, though at an upper end of the push pin throughbore 104. After the barbs 108 of the push pin 102 are extended through the hole 135 of the PCB 134, the stopper 110 may then be moved downwardly in the throughbore 104 to a lower position, such as that shown for the right-hand push pin 102 in FIG. 12. The function of the stopper 110 remains essentially the same, but in this embodiment, the stopper 110 may be held in the throughbore 104 of the push pin 102 throughout the deployment process, potentially easing and speeding use of the assembly 100 and/or helping to avoid losing the stopper 110.

Figure 13:
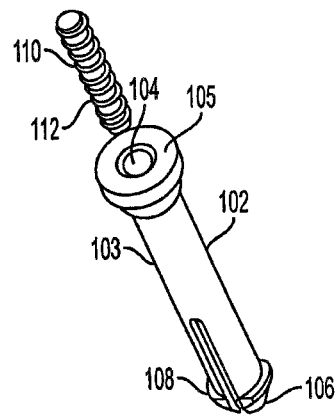
FIG. 13 shows a perspective view of the fastener assembly employed in the FIG. 12 embodiment.
Figure 14:
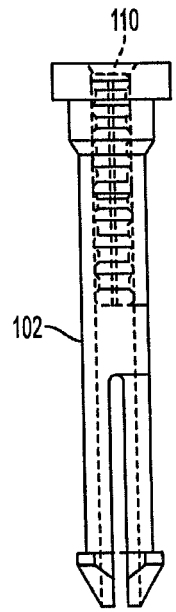
FIG. 14 shows a side view of the fastener assembly employed in the FIG. 12 embodiment with the stopper positioned in a upper portion of the throughbore.
Figure 15:
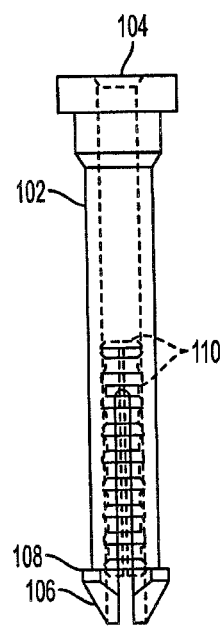
FIG. 15 shows a side view of the fastener assembly employed in the FIG. 12 embodiment with the stopper positioned in a lower portion of the throughbore.
Figure 16:
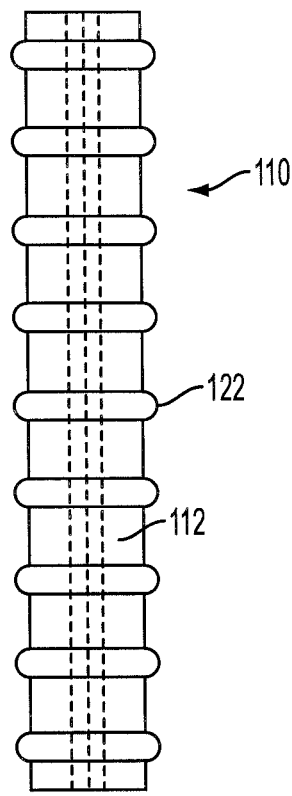
FIG. 16 shows a side view of the stopper in the fastener assembly employed in the FIG. 12 embodiment.
Figure 17:
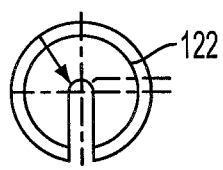
FIG. 17 shows a top view of the FIG. 16 stopper.

FIG. 13 shows an exploded perspective view of a push pin assembly 100 in this illustrative embodiment, and shows the headless or capless stopper 110 positioned for deployment in the throughbore 104. As noted above, the "headless" stopper 110 becomes completely seated within the throughbore 104 of the push pin 102, and it is contemplated that the push pin assembly 100 can be provided to the customer, e.g., a factory or assembly plant, with the stopper 110 partially in place in the push pin 102, e.g., with the stopper positioned in an upper portion of the throughbore 104 of the push pin 102, like that shown in FIG. 14. To lock a push pin 102 into engagement with a PCB hole 135, the stopper 110 may be moved to a lower portion of the throughbore 104, such as a position like that shown in FIG. 15. This position may help resist movement of the barbs 108 toward each other, thus maintaining engagement of the baths 108 with the PCB 134. Any suitable device may be used to deploy the stopper 110 in the throughbore 104, such as a push rod or special-purpose tool.

The headless stopper 110 of this embodiment may result in a reduced or minimum use of material for the stopper 110, and the stopper, once inserted in the throughbore 104 of the push pin 102, may not add to the overall height or length of the pin 102, i.e., there is no cap portion 114 as in the stopper 110 of the embodiment of FIGS. 3-11. An additional possible benefit of the headless stopper 110, the stopper 110 can be removed by pushing it either from the bifurcated end 106 towards the head 105 or, vice versa, from the head 105 towards the bifurcated end 106. This in turn means that the push pin 102 can be removed from the PCB 134 by engaging the stopper 110 from either end of the push pin 102. In one embodiment shown in FIGS. 16 and 17, the stopper 110 is molded from plastic, includes circumferential ribs 122 and has a longitudinal groove 123. One possible benefit of molding the stopper 110 from plastic is that plastic can be readily molded in many colors using well known methods. The color of the stopper 110 selected can be used to identify a push-pin/stopper assembly as having a specific length, diameter, part number, etc., by simply identifying the color of the stopper. Since push pin assemblies will typically be relatively small parts stored in bins, visual differentiation of different pins could be a valuable feature. Also, the ribs 122 and/or longitudinal groove 123 may make the stopper 110 more radially compliant (allowing the stopper to accommodate a variation in throughbore 104 size), allow for regulation of the insertion force used on the stopper (reducing the contact area between the stopper 10 and throughbore 104 may reduce a force needed to move the stopper 110 in the throughbore 104), and/or minimize the amount of material used to make the stopper 110. This minimal material usage may provide yet another benefit; the mass of the stopper may be sufficiently low so that the frictional forces will hold the stopper in place for high g-loads, i.e., the typical accelerations of shock and vibration tests for computer equipment. Although a preferred embodiment comprises a metal push pin and a plastic stopper it is contemplated that both the pin and the stopper could be plastic, both the push pin and the stopper could be metal or a plastic push pin could use a metal stopper. Of course, other arrangements are possible for a stopper 110 like that in this embodiment, such as replacing the ribs 122 with thread or partial thread features, e.g., that provide for longitudinal movement of the stopper 110 in the throughbore 104 with rotation of the stopper 110.

Figures 18, 19:
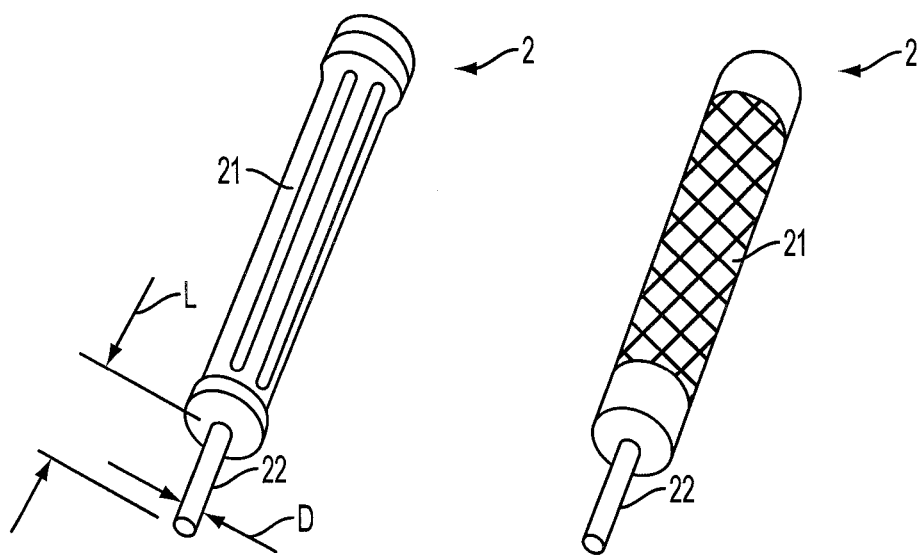
FIG. 18 shows a stopper insertion/removal tool.
FIG. 19 shows an alternate stopper insertion/removal tool.

FIGS. 18 and 19 shows a perspective view of exemplary tools for use in deploying a stopper arranged like that in FIGS. 12-17. The tools 2 may each have a handle 21 and working end 22 that contacts the stopper 110 to move the stopper 110 in the throughbore 104. The size D and length L of the working end 22 may be arranged to fit into the throughbore 104 and move the stopper 110 suitably in the throughbore 104 to ensure engagement of the push pin 102 with a PCB 134. For example, the size D may be equal to or less than the size of throughbore 104, and the length L may be arranged so that with the working end 22 fully inserted into the throughbore 104 and the distal end of the handle 21 in contact with the head 105, the stopper 110 will be located in the position shown in FIG. 15. The handle 21 of the tools 2 may have flutes (FIG. 18) or knurling (FIG. 19) to aid in a user's grip.

A tool 2 like the ones shown in FIGS. 18 and 19 may be used to remove a stopper 110 from a push pin 102. For use as a removal tool, the length L may be different (e.g., made adjustable) than that used for installation, e.g., the length L may be longer than the push pin throughbore 104 so that the stopper 110 can be pushed all the way through, and out of, the pin throughbore 104. The form of an installation and/or removal tool 2 shown in FIGS. 18 and 19 is meant only to provide an example—other forms of the tool 2 are contemplated. For example, the working end 22 of the tool 2, though depicted as circular in cross section, could alternatively be of hexagonal, square or other cross sectional shape. Examples of appropriate material for the tool include metal, plastic, a composite material or a ceramic material.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. A fastener assembly for use in securing a heat sink to a component having a heat source, the fastener comprising:
   a metal push pin having an elongated body with a bifurcated distal end and a throughbore extending longitudinally through the elongated body, the bifurcated distal end including a pair of movable portions that are movable to flex toward and away from each other and arranged to engage at a hole of the component; and
   a stopper having a barrel that is sized to fit within, and be movable longitudinally in, the throughbore, the stopper being separable from the push pin, wherein the stopper is headless, is arranged to be positioned completely within the throughbore of the push pin by pushing the stopper into the throughbore, and includes a plurality of circumferential ribs on the barrel or a longitudinal groove on an outer surface of the barrel to make the stopper radially compliant,
   wherein with a portion of the stopper positioned in the throughbore at the bifurcated distal end, the movable portions are prevented from moving toward each other.

2. The fastener assembly of claim 1, wherein the bifurcated end includes a barb on each of the movable portions, the barbs being arranged to engage with a surface of the component at the hole.

3. The fastener assembly of claim 1, wherein the elongated body includes a slot or groove through the body to form the bifurcated end.

4. The fastener assembly of claim 1, wherein the push pin includes a head at an end of the elongated body opposite the bifurcated end.

5. The fastener assembly of claim 1, wherein the stopper includes a bifurcated end at a distal end of the barrel arranged to support the bifurcated end of the push pin.

6. The fastener assembly of claim 1, wherein the stopper includes a plurality of circumferential ribs on the barrel and a longitudinal groove to make the stopper radially compliant.

7. A heat source and heat sink assembly, comprising:
   a heat source attached to a component having one or more openings, the heat source having a heat transfer surface;
   a heat sink having a heat receiving surface in contact with the heat transfer surface and a fastener engaging portion; and
   at least one fastener assembly engaged with the fastener engaging portion of the heat sink and an opening of the component, the at least one fastener including:
      a metal push pin having an elongated body with a bifurcated distal end and a throughbore extending longitudinally through the elongated body, the bifurcated distal end including a pair of movable portions that are movable to flex toward and away from each other and arranged to be inserted into and engage at the opening of the component; and a stopper having a barrel that is sized to fit within, and be movable longitudinally in, the throughbore, the stopper being separable from the push pin, wherein the stopper is headless, is arranged to be positioned completely within the throughbore of the push pin by pushing the stopper into the throughbore, and includes a plurality of circumferential ribs on the barrel or a longitudinal groove on an outer surface of the barrel to make the stopper radially compliant, wherein with a portion of the stopper positioned in the throughbore at the bifurcated distal end, the movable portions are prevented from moving toward each other to maintain engagement of the bifurcated end with the opening.

8. The assembly of claim 7, wherein the bifurcated end includes a barb on each of the movable portions, the barbs being arranged to engage with a surface of the component at the opening through which bifurcated end is inserted.

9. The assembly of claim 7, wherein the elongated body includes a slot or groove through the body to form the bifurcated end.

10. The assembly of claim 7, wherein the push pin includes a head at an end of the elongated body opposite the bifurcated end.

11. The assembly of claim 7, wherein the stopper includes a bifurcated end at a distal end of the barrel arranged to support the bifurcated end of the push pin.

12. The assembly of claim 7, wherein the stopper includes a plurality of circumferential ribs on the barrel and a longitudinal groove to make the stopper radially compliant.

13. A method for engaging a heat source with a heat sink assembly, comprising:

providing a heat source attached to a component having one or more openings, the heat source having a heat transfer surface;

positioning a heat receiving surface of a heat sink in contact with the heat transfer surface;

engaging a metal push pin with a fastener engaging portion of the heat sink;

inserting a bifurcated distal end of the push pin through an opening of the component to attach the heat sink to the component, the bifurcated distal end including a pair of movable portions that flex toward each other during insertion of the bifurcated end through the opening; and inserting a stopper that is separable from the push pin into a throughbore of the push pin by pushing the stopper into the throughbore so as to position a portion of the stopper in the throughbore at the bifurcated distal end of the push pin, positioning of the portion of the stopper in the throughbore at the bifurcated distal end preventing movement of the movable portions toward each other to maintain engagement of the bifurcated end with the opening of the component, wherein the stopper is headless, is arranged to be positioned completely within the throughbore of the push pin, and includes a plurality of circumferential ribs on the barrel or a longitudinal groove on an outer surface of the barrel to make the stopper radially compliant.

14. The method of claim 13, wherein the step of inserting a bifurcated end includes flexing the movable portions away from each other once barbs on the movable portions pass through the opening, flexing of the movable portions away from each other causing the barbs to engage with a surface of the component at the opening.

15. The method of claim 13, wherein the step of inserting a stopper includes causing the portion of the stopper positioned at the bifurcated end to urge the movable portions away from each other.

16. The method of claim 13, wherein the bifurcated end includes a barb on each of the movable portions, the barbs being arranged to engage with a surface of the component at the opening through which bifurcated end is inserted.

17. The method of claim 13, wherein the push pin includes an elongated body with a slot or groove through the body to form the bifurcated end.

18. The method of claim 13, wherein the push pin includes a head at an end opposite the bifurcated end.

19. The method of claim 13, wherein the stopper includes a plurality of circumferential ribs on a barrel and a longitudinal groove to make the stopper radially compliant.

* * * * *